(12) United States Patent
Bellaouar

(10) Patent No.: US 6,265,898 B1
(45) Date of Patent: Jul. 24, 2001

(54) CURRENT MODE LOGIC GATES FOR LOW-VOLTAGE HIGH SPEED APPLICATIONS

(75) Inventor: Abdellatif Bellaouar, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/669,025

(22) Filed: Sep. 25, 2000

Related U.S. Application Data

(62) Division of application No. 09/114,780, filed on Jul. 13, 1998.

(51) Int. Cl.[7] ................................................. H03K 19/00
(52) U.S. Cl. ................................. 326/93; 326/29; 326/79
(58) Field of Search ............................... 326/29, 93, 99; 377/47, 48; 327/115, 117

(56) References Cited

U.S. PATENT DOCUMENTS

| | | | |
|---|---|---|---|
| 4,590,392 | 5/1986 | Vu | 307/446 |
| 5,055,800 | 10/1991 | Black et al. | 331/1 A |
| 5,077,764 | 12/1991 | Yamashita | 377/116 |
| 5,373,203 | 12/1994 | Nicholes et al. | 326/106 |
| 5,499,280 * | 3/1996 | Wilson et al. | 377/108 |
| 5,557,649 * | 9/1996 | scheckel et al. | 377/48 |
| 5,581,214 | 12/1996 | Iga | 331/16 |
| 5,945,848 | 8/1999 | Ali | 326/127 |
| 6,157,693 * | 12/2000 | Jayaraman | 377/47 |

* cited by examiner

*Primary Examiner*—Michael Tokar
*Assistant Examiner*—Anh Q. Tran
(74) *Attorney, Agent, or Firm*—Ronald O. Neerings; Wade J. Brady, III; Frederick J. Telecky, Jr.

(57) ABSTRACT

A new family of current mode logic (CML) gates (14) which, in one embodiment includes OR/NOR and AND/NAND gates, as well as more complex logic functions. The circuit uses a complementary signal to drive the gate of a feedback transistor (19) which has the effect of pseudo differential operation. Although it uses only single-ended inputs (A, B), because of this feedback aspect, the circuit has many of the advantages of a differential circuit such as low-voltage operation, higher immunity to noise, and less sensitivity to parasitic elements.

4 Claims, 5 Drawing Sheets

CURRENT MODE LOGIC GATES FOR LOW-VOLTAGE HIGH SPEED APPLICATIONS

This divisional claims priority under 35 U.S.C. §119(e)(1) of application Ser. No. 09/114,780, filed Jul. 13, 1998, on entirety of which is incorporated herein by reference.

TECHNICAL FIELD OF THE INVENTION

This patent relates to current-mode logic (CML) circuitry and more specifically to a new low-voltage, high-speed gate family consisting of both OR/NOR and AND/NAND logic functions, as well as other more complex functions. These logic gates are needed in many high speed applications where operation in the GHz range is required, such as in products which address the rapidly growing wireless and portable markets.

BACKGROUND OF THE INVENTION
Brief Description of the Prior Art

Current mode logic (CML) or emitter coupled logic (ECL) circuits are commonly used in high speed applications operating in the GHz frequency range. In these circuits, to reduce the storage time, caused by the presence of minority carriers, the transistors are usually not allowed to operate in hard saturation. Storage time, which is the time before an on transistor starts to turn off, tends to decrease the speed of the circuit. In CML circuits a constant current is maintained in the emitter legs of the transistors with current switching from one transistor leg to another depending on the states of the input signals.

FIG. 1 (prior art) shows one version of a conventional OR/NOR gate implemented in MOS CML. The circuit is made up of stacked transistors pairs 3–4 and 5–6 which allows for differential inputs A/$\overline{A}$ and B/$\overline{B}$ to be applied, respectively. Current source 7 maintains a constant current I through the legs of the circuit at all times. There are three paths, one of which will always be enabled, for current to flow through the circuit, as follows: a) through resistor 1 and transistors 3 and 5, b) through resistor 1 and transistor 6, and c) through resistor 2 and transistors 4 and 5. In the circuit, the signals at A/$\overline{A}$ have to operate with a DC voltage shift relative to the signals at B/$\overline{B}$. For very low $V_{DD}$ voltages there is limited headroom available for this voltage shift in order to maintain proper drain-to-source voltage, $V_{ds}$, across the transistors and this usually limits the number of complementary inputs to two. One way to accomplish this voltage shift is with the use of source followers but these add complexity and tend to slow down the circuit. This circuit provides both OR (A+B) and it's complementary NOR ($\overline{A+B}$) outputs. A truth table for the circuit is included below.

| A | B | OR<br>A + B | NOR<br>$\overline{A+B}$ |
|---|---|---|---|
| 0 | 0 | 0 | 1 |
| 1 | 0 | 1 | 0 |
| 0 | 1 | 1 | 0 |
| 1 | 1 | 1 | 0 |

Here the difference between a logic 0 and logic 1 is small, on the order of 400 to 800 mVolts. Some drawbacks of the circuit include:
1. Not suitable for ultra-low voltage operation of <1.2 volts due to the circuit's limited headroom for $V_{ds}$ across the stacked transistors pairs.
2. Limited to two inputs, A/$\overline{A}$ and B/$\overline{B}$.

3. Signals B and $\overline{B}$ have to be DC shifted compared to signals A and $\overline{A}$.

Although this gate is inherently fast, the required level shifting circuitry, not shown, tends to slow the overall operation of the circuit.

FIG. 2 (prior art) shows another commonly used CML circuit which overcomes the problems of the circuit in FIG. 1, but as will be discussed, has its own set of problems. Singled-ended input signals A and B are inserted at the gates of transistors 10 and 11. Resistor 8 connects the drains of transistors 10 and 11 to $V_{DD}$ to provide a path for current to flow into current source 13 when either or both of these inputs are high (logic level 1). This circuit is not limited to two inputs, although only two are shown, and overcomes the DC level shifting problem of the previous circuit by operating all the transistors at the same voltage level. In addition, transistor 12 and resistor 9 are used to provide another path for current I to flow into current source 13 when both of the input transistors 10 and 11 are OFF. The $V_{ref}$ input is a DC level which biases transistor 12 at the mid-point of the A and B input signal's voltage swing. If both A and B inputs are low (logic level 0), all the current I will flow through $V_{ref}$ transistor 12. Then as inputs A and/or B turn on (logic level 1) current will switch and flow through transistors 10 and/or 11. As with the previous circuit, both OR (A+B) and it's complementary NOR ($\overline{A+B}$) outputs are generated. Although this circuit does overcome the problems of the previous circuit, it has its own drawbacks, as follows:

1. A reference voltage at mid-signal is required.
2. The circuit only allows single-ended inputs which usually implies larger input swings. This in turn can increase the voltage supply size and reduces the circuit speed. An alternative sometimes used is to keep the input swing constant and increase the size of the MOS transistors, but this also negatively impacts the circuit speed.
3. Less immunity to noise due to single-ended operation.
4. Circuit delay is more sensitive to the parasitic elements at node N1 since the node has more movement with $V_{ref}$ remaining constant while the inputs A and B move.

SUMMARY OF THE INVENTION

There is a rapidly growing need in the wireless and portable markets, as well as other markets, for ultra low-power/low-voltage circuitry. High-speed logic circuits operating in the GHz range are more and more in demand. Emitter coupled logic (ECL) circuits represent one family that has been extensively used in wireless applications such as the phase lock loop (PLL) in prescalers and optical communication systems. And more recently CMOS current mode logic is becoming prevalent in the GHz domain.

This invention describes a new family of current mode logic (CML) gates which includes OR/NOR, AND/NAND gates, and other more complex functions, all of which use a complementary feedback signal to drive the gate of the $V_{ref}$ transistor 12 (FIG. 2) rather than a DC voltage often found in more conventional CML gate circuits. As a result of this feedback, the circuit operates in a pseudo differential manner although it uses only single-ended inputs. Because of this feedback aspect, the circuit has been called feedback current mode logic circuit or FCML. This circuit has both the advantages of the circuit of FIG. 2 and overcomes its drawbacks. The circuit switches current, controlled by a constant current source, between the input transistors and the complementary controlled transistor and can be configured with multiple inputs by adding additional transistors in parallel.

The new CML gate family described in this patent can be applied to CMOS, bipolar, BiCMOS, and other technologies today and will be adaptable to future technologies as well. As mentioned earlier, this family of gates eliminates several of the problems associated with conventional circuits of this type and offers its own advantages, as follows:

1. Suitable for low and ultra-low voltage operation.
2. Operates in a pseudo-differential manner.
3. Speed is less sensitive to parasitic elements associated with the circuit at the common source in a typical CMOS implementation.
4. Does not require a reference voltage needed in the conventional circuit of FIG. 2.
5. Has good noise margins.

DESCRIPTION OF THE PREFERRED EMBODIMENT

Figure 3:
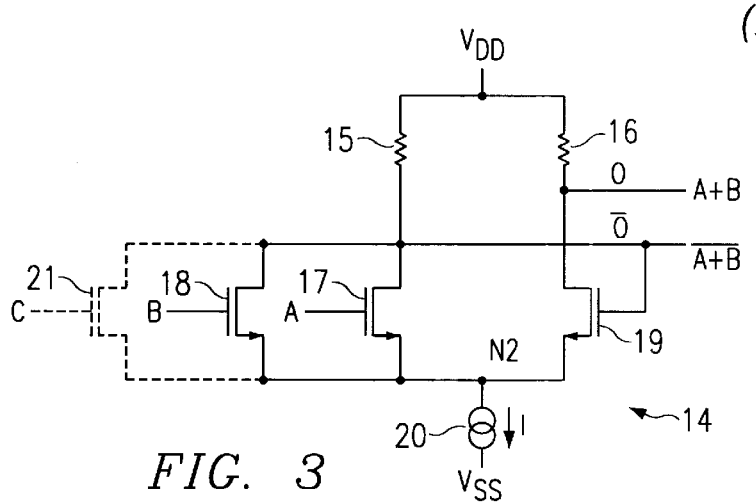
FIG. 3 is a schematic diagram of an OR/NOR gate in MOS CML according to one embodiment of the invention.

FIG. 3 shows the schematic for the current mode logic gate 14, according to the invention, which overcomes most of the problems discussed in the prior art. On the input side, the basic circuit is comprised of resistor 15 and transistors 17 and 18. Additional inputs, indicating by shadowed transistor 21 at input C, can be provided by adding additional transistors in parallel with transistors 17 and 18. Resistor 16 and transistor 19 provide a path for current to flow when both inputs A and B (all inputs) are inhibited. The sources of all the transistors 17–19 and 21 are tied together and connected to a constant current source 20. In the schematic the power supply voltages are shown as $V_{DD}$ and $V_{SS}$. In this circuit, $V_{DD}$ may be quite small, for example 1.8 volts or less while the input voltage swings will typically range from 400 to 800 mVolts. $V_{SS}$ is commonly operated at ground potential. The current paths in the circuit are clearly seen to be through a) resistor 15, transistor 17, and current source 20 and/or b) resistor 15, transistor 18, and current source 20 or c) resistor 16, transistor 19, and current source 20. Again, resistor 16 and transistor 19 provide a path for current to flow when both input signals, A and B, are low (0 state). At the very center of this invention is the way the gate of transistor 19 is controlled by tying it to the common drain connection of transistors 17 and 18. This feedback connection overcomes the problems associated with the DC reference voltage of conventional CML circuits. Because of this feedback, the circuit operates in a pseudo differential mode which means that there is only a small movement at node N2; i.e., N2 remains fairly stable since the source of feedback transistor 19 moves complementary to that of input transistors 17 and 18. Also, there is some hysterisis present in the circuit which should provide improved noise margins. Due to the feedback aspect of the circuit, it has been suggested that the circuit be called FCML. The circuit provides complementary outputs O and $\overline{O}$, as shown. Operation of the circuit is as follows, assume that initially both inputs, A and B, are low (0) and transistors 17 and 18 are off such that $\overline{O}$ is high (1). In this initial condition, the feedback in the circuit causes transistor 19 to turn on and as a result O is low (0). Now, when one or both of the inputs, A and/or B, goes high (1), transistor 17 and/or 18 will start to turn on and due to the complementary feedback, as the gate voltage of transistor 19 decreases, transistor 19 starts to turn off and O increases. At the end of this transient state when the circuit reaches steady state, outputs O and $\overline{O}$ will be high (1) and low (0), respectively. The complementary nature of the circuit provides both the OR and NOR functions at outputs O and $\underline{O}$. In the circuit, output O represents the OR function A+B and $\overline{O}$ represents the NOR function $\overline{A+B}$. A truth table indicating the circuit's output states for the four possible input conditions is shown below.

| A | B | OR<br>A + B | NOR<br>$\overline{A+B}$ |
|---|---|---|---|
| 0 | 0 | 0 | 1 |
| 1 | 0 | 1 | 0 |
| 0 | 1 | 1 | 0 |
| 1 | 1 | 1 | 0 |

Figure 1:
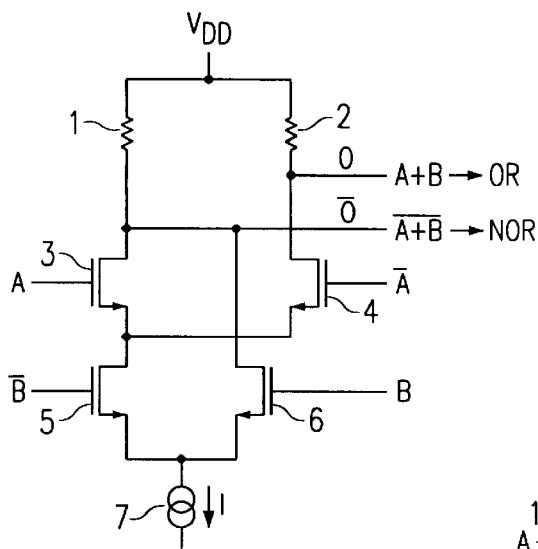
FIG. 1 is a schematic diagram of a conventional OR/NOR gate in MOS CML.
Figure 2:
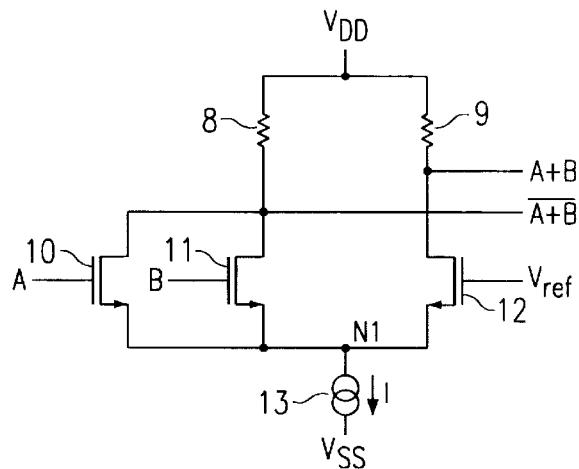
FIG. 2 is a schematic diagram of another conventional OR/NOR gate with voltage reference in MOS CML.

At first consideration, it would appear that this circuit is slower than the conventional circuit of FIG. 1, due to the feedback circuitry. However, once source followers are added to the circuit of FIG. 1 to provide the DC level shift at inputs A/$\overline{A}$ and B/$\overline{B}$, the speed of the two circuits are comparable and the power dissipation for the FCML of this invention is favorable.

Figure 4:
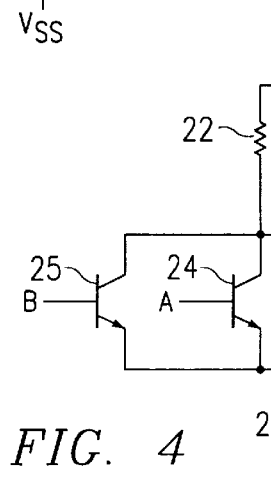
FIG. 4 is a schematic diagram of an OR/NOR gate in bipolar technology according to another embodiment of the invention.

The FCML gate can be implemented using any number of technologies. FIG. 4 shows the same OR/NOR FCML circuit 14 implemented with bipolar technology. As shown, the resistors 22–23, transistors 24–26, and current source 27 match those of the MOS version discussed above, with the exception that now transistors 24–26 are bipolar transistors.

Figure 5:
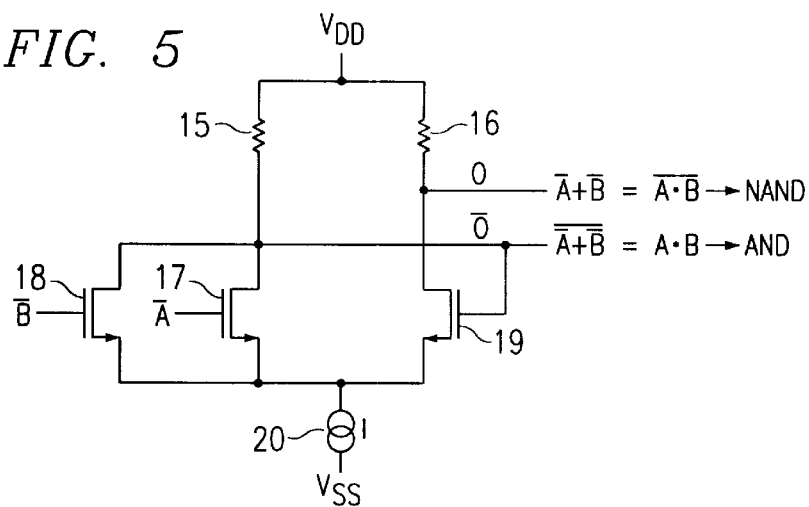
FIG. 5 is a schematic diagram of an AND/NAND gate implementation of the invention in MOS CML.

FIG. 5 shows another embodiment of the invention for an AND/NAND circuit which is the same circuit 14 as shown in FIG. 3, but with the inputs now being $\overline{A}$ and $\overline{B}$. Therefore, all that is necessary to generate the AND/NAND function is to provide the complements $\overline{A}$ and $\overline{B}$ at the inputs to the circuit, as shown in FIG. 5. As in the earlier OR/NOR circuit, additional inputs can be included. The logic functions at the O and $\overline{O}$ outputs then become $\overline{\overline{A}+\overline{B}}$ and $\overline{A}+\overline{B}$, respectively. Using De Morgan's Law, it is seen that outputs O and $\overline{O}$ are $\overline{A\cdot B}$ and $A\cdot B$, the NAND and AND functions, respectively. A truth table for this circuit is shown below.

| A | B | AND<br>A · B | NAND<br>$\overline{A \cdot B}$ |
|---|---|---|---|
| 0 | 0 | 0 | 1 |
| 1 | 0 | 0 | 1 |
| 0 | 1 | 0 | 1 |
| 1 | 1 | 1 | 0 |

Likewise, other more complex logic functions can be applied to the circuit. For example, assume that the circuit is configured for three inputs, say A, $\overline{B}$, and $\overline{C}$, then the Boolean expressions at outputs O and $\overline{O}$ become $A+\overline{B}+\overline{C}=\overline{A \cdot B \cdot C}$ and $\overline{A+\overline{B}+\overline{C}}=\overline{A} \cdot B \cdot C$, respectively. The truth table for this conditions is as follows.

Q $\overline{Q}$

| A | B | C | $\overline{A \cdot B \cdot C}$ | $\overline{A} \cdot B \cdot C$ |
|---|---|---|---|---|
| 0 | 0 | 0 | 1 | 0 |
| 0 | 0 | 1 | 1 | 0 |
| 0 | 1 | 0 | 1 | 0 |
| 0 | 1 | 1 | 0 | 1 |
| 1 | 0 | 0 | 1 | 0 |
| 1 | 0 | 1 | 1 | 0 |
| 1 | 1 | 0 | 1 | 0 |
| 1 | 1 | 1 | 1 | 0 |

Figure 6:
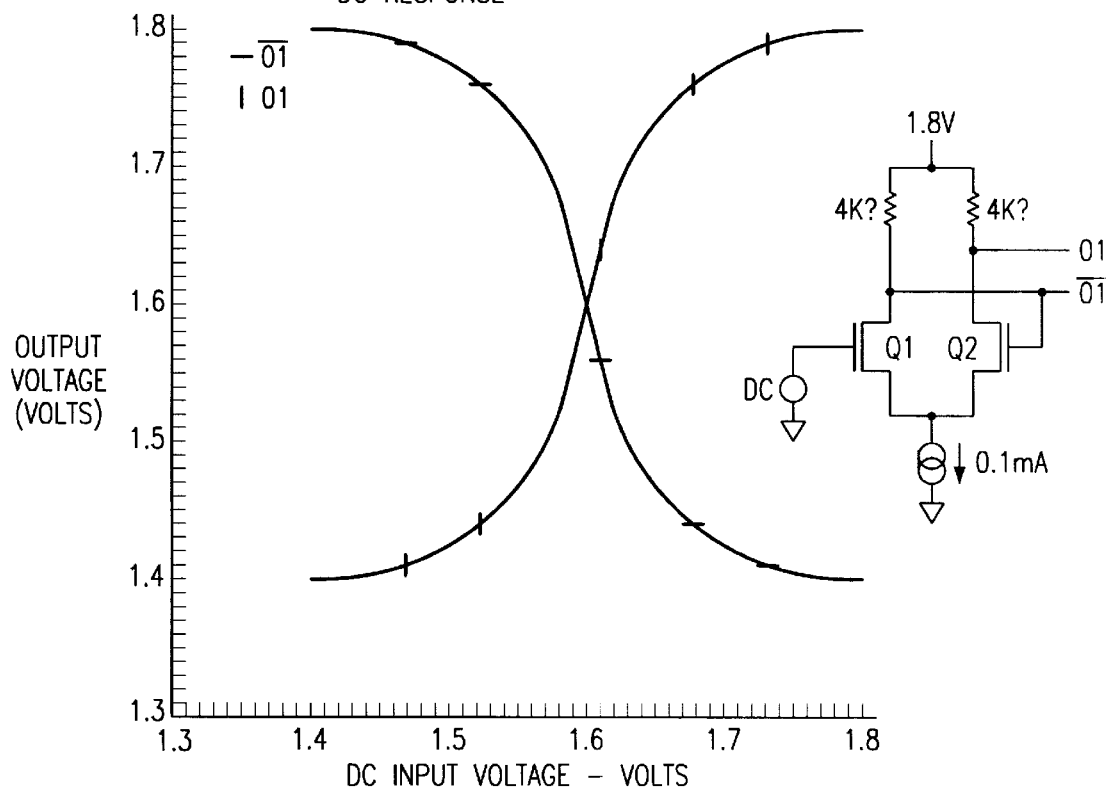
FIG. 6 illustrates simulation results of the DC characteristics for the basic OR/NOR gate of this invention in MOS CML.

FIG. 6 shows simulation results for the DC characteristics of the OR/NOR FCML gate. In this example, $V_{DD}$ is 1.8 volts, $V_{SS}$ is ground, and the current source has 0.1 mA flowing through it. Only one input, a DC level, is used in this simulation. As shown in the data, the outputs O and $\overline{O}$ have a swing of approximately 0.4 volts from 1.4 to 1.8 volts. The output transition crossover point occurs at mid-range, 1.6 volts, of the required input voltage swing.

Figure 7:
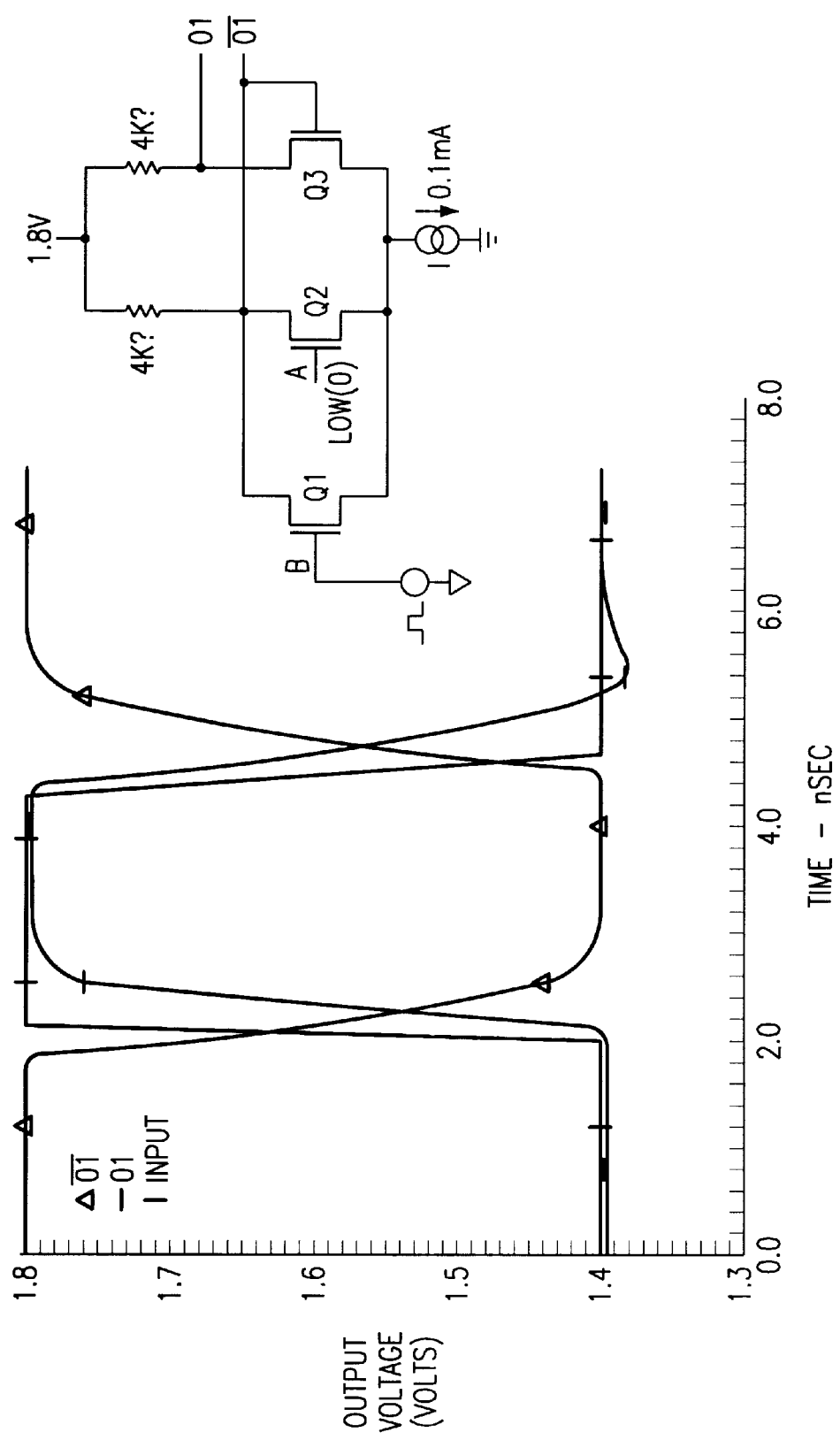
FIG. 7 illustrates simulation results of the transient response for the basic OR/NOR gate of this invention in MOS CML.

FIG. 7 shows simulation results of the transient response for the same circuit discussed in FIG. 6. In this case, input A is low (0) and input B uses a pulse generator with amplitude varying from 1.4 to 1.8 volts. The rise and fall times for the two outputs, O and $\overline{O}$, are shown. The abscissa represents time in nSeconds.

This family of gates is expected to find very broad usage. One example is in the phase-lock-loop (PLL) circuit of a cellular phone where multiple input gates operating in the GHz range are merged with other conventional circuit functions. FIGS. 8a–8e show an example of this application with the gates used as both D-type flip-flops and OR gate functions in a PLL prescaler circuit.

Figure 8A:
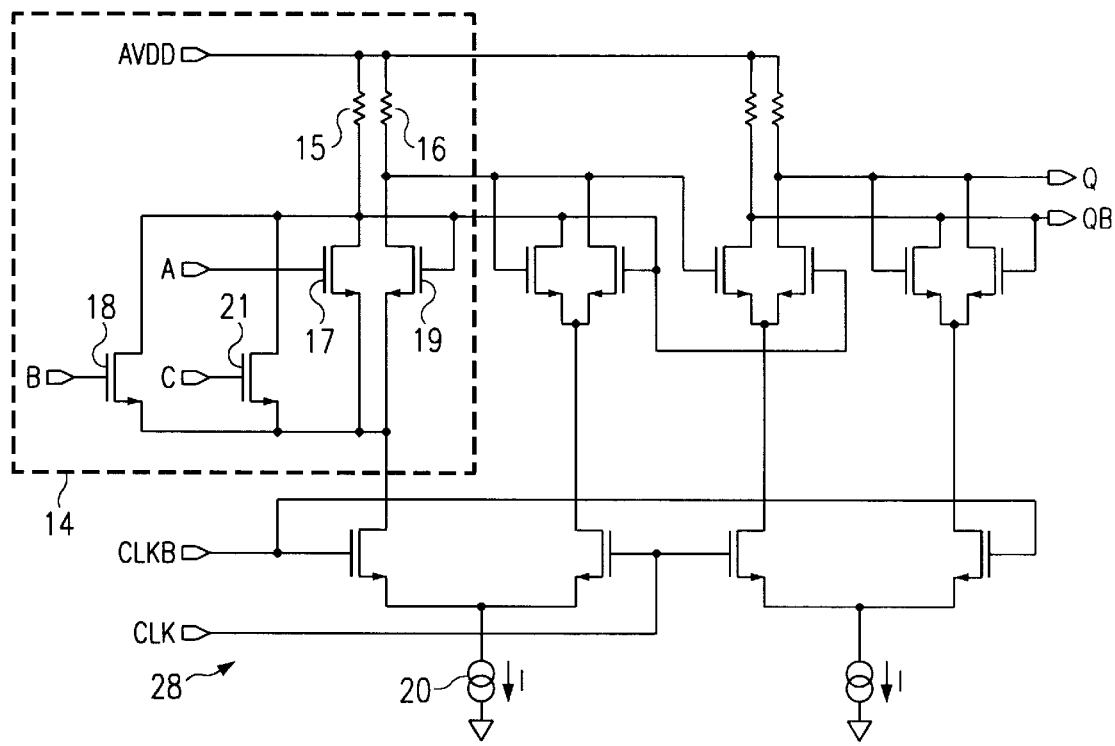
FIG. 8a shows a 3-input FCML gate in a D-type flip-flop function in the prescaler of a cellular phone.

FIG. 8a is the schematic diagram of a D-type flip-flop 28 used in the prescaler function of a cellular phone. The input to this flip-flop consists of a 3-input FCML gate 14 merged with other functions in the flip-flop circuit. This identical 3-input flip-flop circuit 28, as well as another 2-input version of the same circuit 29 is used in the prescaler 31 function of the cellular phone, as shown below in FIG. 8c.

Figure 8B:
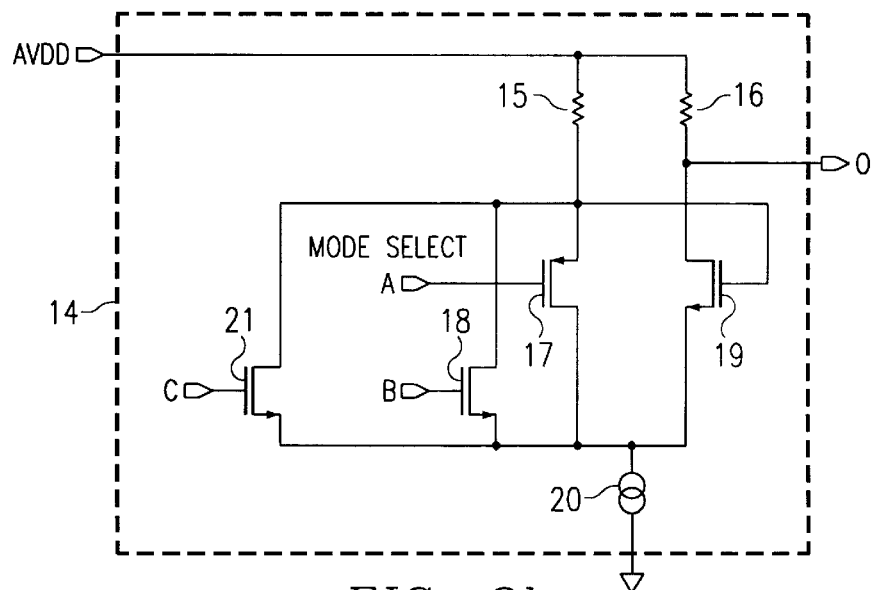
FIG. 8b is a 3-input FCML OR gate used as the mode select function in the prescaler application in a cellular phone.
Figure 8C:
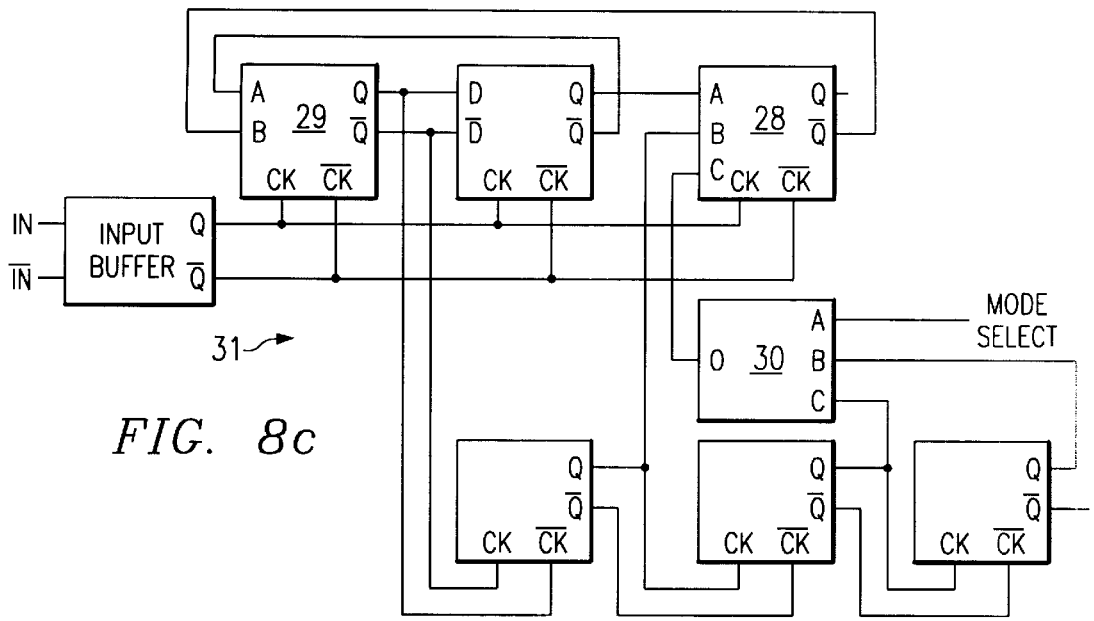
FIG. 8c is a block diagram of a prescaler circuit showing three FCML circuits used in flip-flop and OR gate functions.

FIG. 8b shows the schematic for a 3-input FCML OR gate 14 used as the mode selection function 30, also in the prescaler circuit 31 of FIG. 8c.

FIG. 8c is the block diagram for a prescaler 31 in a cellular phone. As illustrated, this circuit merges three (3) of the FCML gates; (i) a 3-input D-type flip-flop 28, (ii) another 2-input D-type flip-flop 29, and (iii) a 3-input FCML OR gate 30 with other conventional circuitry in the prescaler circuit.

Figure 8D:
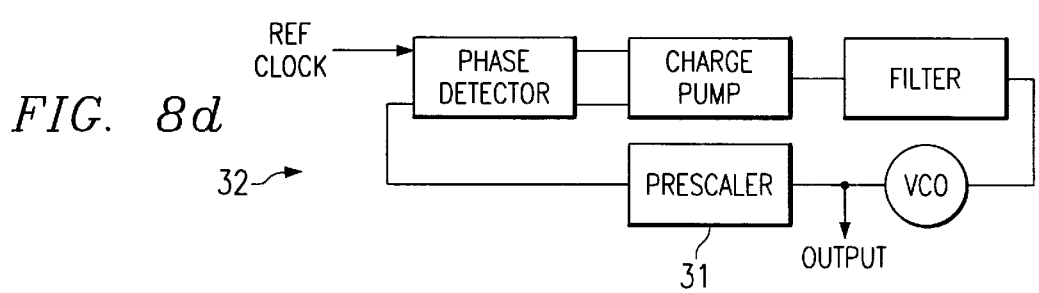
FIG. 8d is a block diagram of a phase-lock-loop in a cellular phone showing the prescaler function.

FIG. 8d is a block diagram for a typical phase-lock-loop (PLL) circuit 32 used in a cellular phone. This shows how the prescaler 31, with the FCML gates, is used in the loop.

Figure 8E:
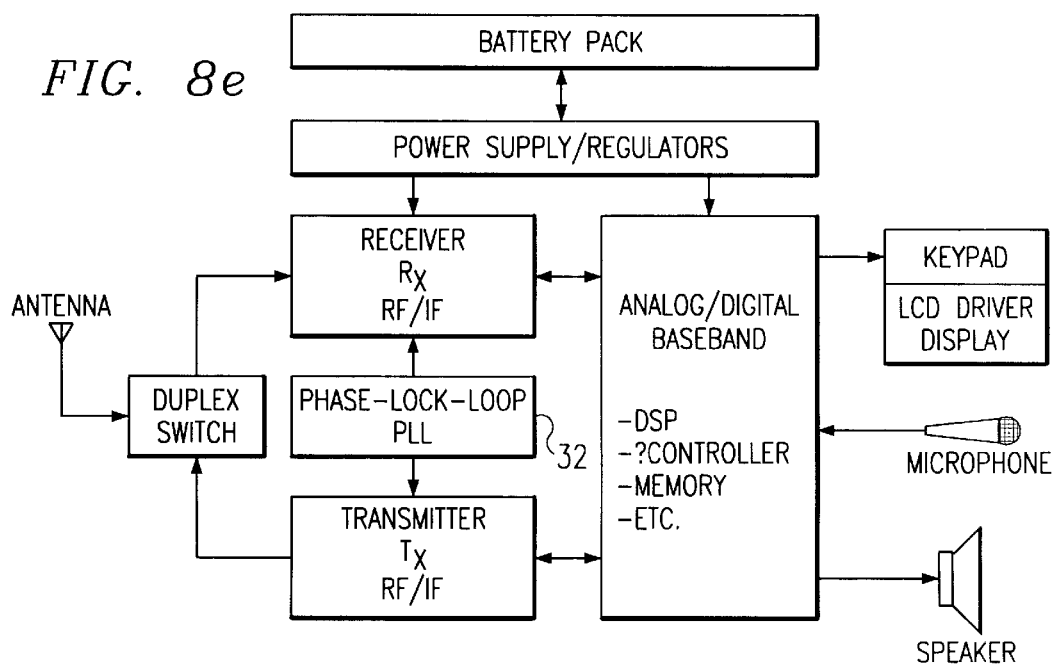
FIG. 8e is a block diagram for a typical cellular phone showing the phase-lock-loop function.

FIG. 8e is a typical block diagram for a cellular phone showing the receiver and transmitter RF/IF portions, the baseband controller functions, the power supply, and the user input/output functions. Of particular interest relative to this invention is the phase-lock-loop (PLL) 32 circuit. In a typically cellular phone there may be 2 or 3 phase-lock-loops involved. As discussed above, each of these phase-lock-loops has at least three (3) high speed gate circuits which can be enhanced through the use of the high-speed, low-voltage FCML gates of this invention. And while a single analog/digital baseband is shown, a cellular phone could also use separate analog and digital basebands.

Although this represents one important application of the FCML gate family, many other uses where high-speed, very low voltage logic gates are needed will gain an advantage from this family of gate circuits.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

What is claimed is:

1. A prescaler circuit, comprising:

an input buffer coupling input signals to clock and inverted clock signal inputs of first, second and third flip-flops;

a first input of said first flip-flop coupled to a first output of said second flip-flop;

a second input of said first flip-flop coupled to a first output of said third flip-flop;

a first output of said first flip-flop coupled to a first input of said second flip-flop and to a first clock input of a fourth flip-flop;

a second output of said first flip-flop coupled to a second input of said second flip-flop and to a second clock input of said fourth flip-flop;

a second output of said second flip-flop coupled to a first input of said third flip-flop;

a first output of said fourth flip-flop coupled to a second input of said third flip-flop and to a first clock input of a fifth flip-flop;

a second output of said fourth flip-flop coupled to a second clock input of said fifth flip-flop;

a third input of said third flip-flop coupled to the output of a logic gate;

a first input of said logic gate coupled to receive a select signal;

a first output of said fifth flip-flop coupled to a first clock input of a sixth flip-flop and to a second input of said logic gate;

a second output of said fifth flip-flop coupled to a second clock input of said sixth flip-flop;

a third input of said logic gate coupled to a first output of said sixth flip-flop.

2. The prescaler circuit of claim 1, further comprising an input buffer coupling said first and second inputs to said first and second clock inputs of said first, second and third flip-flops.

3. The prescaler circuit of claim 1, wherein said first clock input is a non-inverted clock input and said second clock input is an inverted clock input.

4. The prescaler circuit of claim 1, wherein:

said first output of said first flip-flop is a non inverted output and said second out put is an inverted output;

said first output of said second flip-flop is an inverted output and said second output is a non-inverted output; and said first output of said third flip-flop is an inverted output and said second output is a non-inverted output, said first output of said fourth flip-flop is an inverted output and said second output is a non-inverted output, said first output of said fifth flip-flop is an inverted output and said second output is a non-inverted output, said first output of said sixth flip-flop is an inverted output and said second output is a non-inverted output.

* * * * *